United States Patent
Jimarez et al.

(10) Patent No.: US 6,191,952 B1
(45) Date of Patent: Feb. 20, 2001

(54) COMPLIANT SURFACE LAYER FOR FLIP-CHIP ELECTRONIC PACKAGES AND METHOD FOR FORMING SAME

(75) Inventors: Miquel A. Jimarez, Newark Valley; Eric A. Johnson, Greene; Li Li, Endicott; Jan Obrzut, Vestal, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/067,708

(22) Filed: Apr. 28, 1998

(51) Int. Cl.$^7$ ........................................ H05K 1/18
(52) U.S. Cl. ................ 361/771; 361/768; 361/783; 257/723; 257/737; 257/738; 257/778; 174/256; 174/258; 174/260; 438/108; 438/126
(58) Field of Search ................ 361/748–750, 361/760, 767, 768, 771, 782, 783, 792, 795; 257/723, 724, 737, 738, 778–780, 772; 174/255, 256, 258, 259, 260, 263; 438/108, 125, 126

(56) References Cited

U.S. PATENT DOCUMENTS

| | | | |
|---|---|---|---|
| 4,658,332 | 4/1987 | Baker et al. | 361/751 |
| 4,740,414 | 4/1988 | Shaheen | 428/210 |
| 4,847,136 * | 7/1989 | Lo | 428/195 |
| 4,847,146 * | 7/1989 | Yeh et al. | 428/332 |
| 4,855,872 * | 8/1989 | Wojnar et al. | 361/792 |
| 4,873,615 | 10/1989 | Grabbe | 361/742 |
| 5,026,624 | 6/1991 | Day et al. | 430/280.1 |
| 5,110,867 * | 5/1992 | Schutyser et al. | 525/114 |
| 5,258,648 | 11/1993 | Lin | 257/778 |
| 5,262,280 | 11/1993 | Knudsen et al. | 430/312 |
| 5,278,010 | 1/1994 | Day et al. | 430/18 |
| 5,304,457 | 4/1994 | Day et al. | 430/280.1 |
| 5,329,423 * | 7/1994 | Scholz | 361/767 |
| 5,391,435 * | 2/1995 | Schutyser et al. | 428/416 |
| 5,439,766 | 8/1995 | Day et al. | 430/18 |
| 5,439,779 | 8/1995 | Day et al. | 430/280.1 |
| 5,473,119 | 12/1995 | Rosenmayer et al. | 174/255 |
| 5,493,075 | 2/1996 | Chong et al. | 174/261 |
| 5,496,769 | 3/1996 | Marion et al. | 427/96 |
| 5,511,306 | 4/1996 | Denton et al. | 29/840 |
| 5,535,101 | 7/1996 | Miles et al. | 361/760 |

(List continued on next page.)

OTHER PUBLICATIONS

IBM Technical Disclosure Bulletin, "Elastic Thermal Compensation of Chip Carriers", v.40, No. 4, pp. 85–86 (Disclosure Text including indication of Apr. 1, 1997 publishing date).*

U.S. application No. 09/080,117, Caletka et al., filed May 15, 1998; for Thermally Enhanced and Mechanically Balanced Flip Chip Package and Method of Forming.

U.S. application No. 09/067,707, Susko et al, filed Apr. 28, 1998; for Methods and Apparatus for Balancing Differences in Thermal Expansion in Electronic Packaging.

IBM Technical Disclosure Bulletin, pp. 85–86, vol. 40 No. 4, Apr. 1997 Elastic Thermal Compensation of Chip Carriers.

Primary Examiner—Jeffrey Gaffin
Assistant Examiner—John B. Vigushin
(74) Attorney, Agent, or Firm—James A. Lucas; Driggs, Lucas, Brubaker & Hogg Co., L.P.A.

(57) ABSTRACT

Flip-chip electronic packages are provided with a compliant surface layer, normally positioned between an underfill layer and a substrate such as a chip carrier or a printed circuit board or card, which reduces stress and strain resulting from differences in coefficients of thermal expansion between the chip and substrate. The compliant layer, which should have a storage modulus of less than ½ the modulus of the substrate, preferably between about 50,000 psi and about 20,000 psi, may comprise rubbery materials such as silicone, virco-plastic polymers such as polytetrafluoroethylene or interpenetrating polymer networks (IPNs). Photosensitive IPNs used for solder marks are preferred.

15 Claims, 3 Drawing Sheets

U.S. PATENT DOCUMENTS

| | | | |
|---|---|---|---|
| 5,579,573 | 12/1996 | Baker et al. | 29/840 |
| 5,633,535 | 5/1997 | Chao et al. | 257/778 |
| 5,801,446 * | 9/1998 | DiStefano et al. | 257/778 |
| 5,808,874 * | 9/1998 | Smith | 361/771 |
| 5,821,305 * | 10/1998 | Schutyser et al. | 525/112 |
| 5,866,952 * | 2/1999 | Wojnarowski et al. | 257/724 |
| 6,002,590 * | 12/1999 | Farnworth et al. | 361/750 |
| 6,054,250 * | 4/2000 | Sitzmann et al. | 430/280.1 |

* cited by examiner

COMPLIANT SURFACE LAYER FOR FLIP-CHIP ELECTRONIC PACKAGES AND METHOD FOR FORMING SAME

FIELD OF THE INVENTION

This invention relates to electronic packaging and more particularly to methods and apparatus for improving the reliability of flip-chip connections by accommodating for differences in thermal expansion of the chip and the substrate to which it is attached.

BACKGROUND

Integrated circuit (IC) chips or modules are often connected to chip carriers, and sometimes directly to PC boards or cards, by what is commonly referred to as C4 (controlled-collapsed-chip-connection) or flip-chip attachment technology. Small solder bumps or balls are formed on an active surface of the chip. The chip is then turned over (hence the name "flip-chip") and placed on the carrier, board or other substrate to which it will be attached. The components are heated to cause the solder to reflow in a controlled collapse which completes electrical connections between the chip and substrate. This technology has numerous advantages, including compact connections, electrical performance and cost, that have made it one of the industry standards. There are certain disadvantages, however, that have prevented even wider adoption.

One of the more significant disadvantages results from differences in the coefficients of thermal expansion (CTE) of the chip and substrate. Common chip materials such as silicon, germanium and gallium arsenide usually have CTEs of about 3 to about 6 ppm/° C. Organic chip carriers to which the chips are attached and organic printed circuit boards and cards, which are usually composites of organic dielectrics and metallic circuitry, tend to have CTEs between about 12 and about 20 ppm/° C. As these components are heated and cooled the substrates expand and contract much more than the chips. With a simple chip to substrate connection, the strain from the unequal expansion is absorbed primarily by the soft solder. With repetitive thermal cycles, which are inescapable with many electronic components, the solder joints are likely to fail.

A conventional approach to this problem is to surround the solder joints with a dielectric underfill material that matches or approximates the CTE of the solder joints, which is typically about 22 to about 28 ppm/° C. Typical underfill materials are epoxy-based anhydride systems. They are normally heavily filled with very small particles of materials such as silicon dioxide to produce the desired CTE. The filler also gives the underfill a high modulus (as used herein, the term "modulus" refers to the storage modulus) typically greater than about 2 GPa or about 300 ksi. The underfill bears most of the load resulting from the differential expansion of the chip and substrate, and reduces the strain on the solder joints. However, by restricting the differential expansion between the chip and substrate, the relatively strong coupling between the chip and carrier has a tendency to warp both the chip and carrier. This increases loads acting normal to the surface of the substrate to which the carrier is attached. For example, as the package cools after the carrier has been attached to a printed circuit board or card, typically with an array of solder balls on BGA, the chip and carrier have a tendency to bow upward in the middle, which generates a tensile load on the balls at the center of the array between the carrier and the board or card. This can lead to premature failure of the BGA.

There have been many attempts to mitigate these problems, including stiffeners with a desirable CTE and layers of compliant material within a multi-layer organic printed circuit board or card. Stiffeners are expensive, however, and compliant layers within a board introduce stress concentrations where plated through holes (PTHs) pass through them became of the shear deformation. Thus, the need for reliable and inexpensive ways to accommodate for differential thermal expansion between chips and circuitized organic substrate such as chip carriers and printed circuit boards remains.

SUMMARY OF THE INVENTION

The packages and methods of this invention accommodate CTE differentials between chips and the organic dielectric carriers, boards or other substrates to which the chips are attached with a layer of compliant material positioned between the chip and substrate. The solder connections between the chip and substrate extend through this compliant layer, which is normally used with a conventional underfill. The compliant layer is positioned between the underfill and substrate, and should have a modulus of less than about one-half the modulus of the underfill. Compliant materials with a modulus of less than about 100,000 psi are normally desirable, and materials with a modulus between about 20,000 and about 50,000 psi are preferred.

During thermal cycling of the chip and substrate, one side of the compliant layer conforms to the movement of the underfill and other side of the layer conforms to the movement of the substrate. In doing so, the compliant layer reduces coupling between the chip and substrate, thereby reducing their bending. Various compliant dielectrics can be used for the compliant layer, including rubbery materials such as silicone and visco-plastic polymers such as polytretaflouroethylene. Photosensitive interpenetrating polymer networks, such as those used as masks for the completion of solder connections, are preferred.

Other advantages of this invention will be apparent from the following description.

DRAWINGS

DETAILED DESCRIPTION

Figure 1:
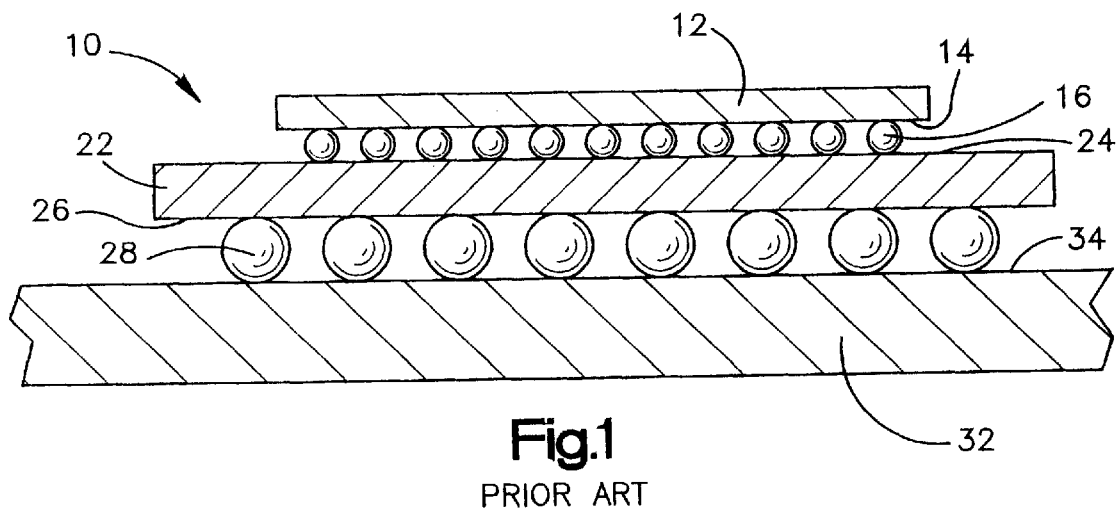
FIGS. 1 and 2 are schematic cross-sectional views of prior art electronic package.

FIG. 1 illustrates a conventional electronic package, generally referred to as 10, with a bare chip 12 connected to a circuitized carrier 22 by C4 connections. As is customary with C4 technology, bumps or balls 16 of solder are attached to contacts 14 on the integrated circuit chip or module 12 with the chip inverted so that the contacts 14 are on top. The chip is then flipped into the illustrated position and the solder balls 16 are aligned with contacts 24 on circuitized carrier 22. The package is then heated to reflow the solder balls 16 and complete the C4 connections between chip 12 and carrier 22. Conventional electrical circuitry (not shown) in the carrier connects the contacts 24 on top of the carrier to a second set of contacts 26 on the bottom of the carrier. A second set of solder balls 28, somewhat larger than the balls 16 that attached the chip 10 to the carrier, is attached to the contacts 26 beneath the carrier. This array of balls 28, conventionally referred to as a Ball Grid Array or BGA, connect contacts 26 to contacts 34 on a printed circuit board, card or other substrate 32. The solder in the BGA balls 28 may be selected to melt at a lower temperature than the solder in the C4 balls 16, so that chip and carrier can be attached to substrate 32 without disturbing the C4 connections.

Conventional chip materials such as silicon, germanium and gallium arsenide have coefficients of thermal expansion of about 3 to about 6 ppm/° C. They are commonly attached to carriers, printed circuit boards and other composite substrates manufactured with organic dielectrics such as glass filled epoxies, polyimides, liquid crystal polymers, filled PTFE and the like. Circuitized carriers, boards and other substrates made of these organic dielectrics typically have CTEs of about 12 to about 20 ppm/° C. Despite this CTE mismatch, circuitized organic dielectrics are used in many applications because they have a number of advantages (including cost, BGA life and dielectric constant) over other materials (such as ceramics) which have CTEs closer to the CTE of the chip. The use of materials with this CTE mismatch does create problems, however. When package 10 is heated or cooled the lateral expansion or contraction of carrier 22 is substantially greater than the lateral expansion or contracting of the chip 12. This creates a shear strain on the C4 solder balls 16. Many electronic components routinely experience thermal cycles in their ordinary operation, and these cycles are sometimes aggravated by environmental conditions. Thermal cycles in excess of 100° C. are rather common. Under extreme operating or environmental conditions they may exceed 125° C. The stress/strain inflicted on the C4 connections by these cycles is one of the primary causes for premature failure of these connections.

Figure 2:
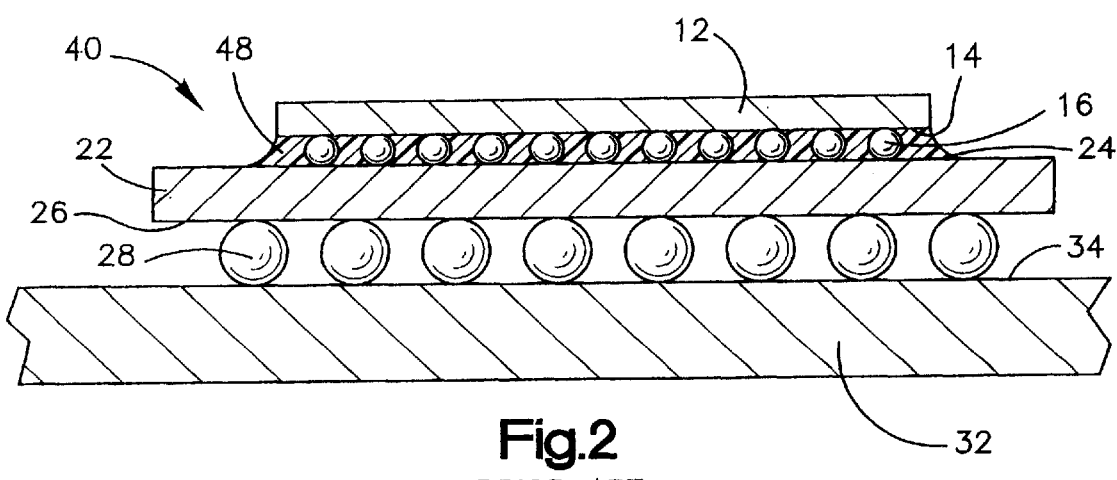

FIG. 2 illustrates another package 40 incorporating one conventional approach to the CTE mismatch problem. The parts of package 40 are essentially the same as those in package 10, except that package 50 has an underfill layer 48 surrounding the C4 solder balls, between the chip 12 and carrier 22. Underfill 48, which may be any of a number of commercially available materials designed for this purpose, is normally dispensed around the periphery of the chip after it has been attached to the substrate, is drawn into the spaces between the C4 connections by capillary action, and then cured. The underfill may also be applied to the chip or the carrier and cured simultaneously with the C4 reflow. The solidified underfill bears most of the load generated by differences in expansion and contraction of chip 12 and carrier 22, which substantially reduces strain on the C4 connections 16.

As mentioned above, underfill materials normally contain considerable amounts of very small particles of materials such as silicon dioxide. The particles are added to the material to give the underfill 48 a CTE substantially equal to the CTE of solder balls 16, which typically have a CTE of about 22 ppm/° C. These coefficients must be matched to keep the underfill from alternately stretching and compressing the C4 balls in the direction normal to the chip surface, which would also produce premature failure. The particulate additions, however, give the underfill materials a high modulus, typically greater than 2 GPa or 300 ksi. When a package of the type illustrated in FIG. 2 is cooled after curing the underfill, the CTE differences and strong coupling between the chip 14 and the carrier 22 tend to warp both the chip and the carrier. This can crack the silicon chip. On cooling after completion of the BGA connections 28 between carrier 22 and substrate 22, warping of the chip and carrier puts a tensile load on the balls 28 at the center of the ball grid array between the carrier and substrate. Subsequent thermal cycles stress these same solder balls, and can cause premature failure. Thus, an underfill layer by itself is not an entirely satisfactory solution.

Figure 3:
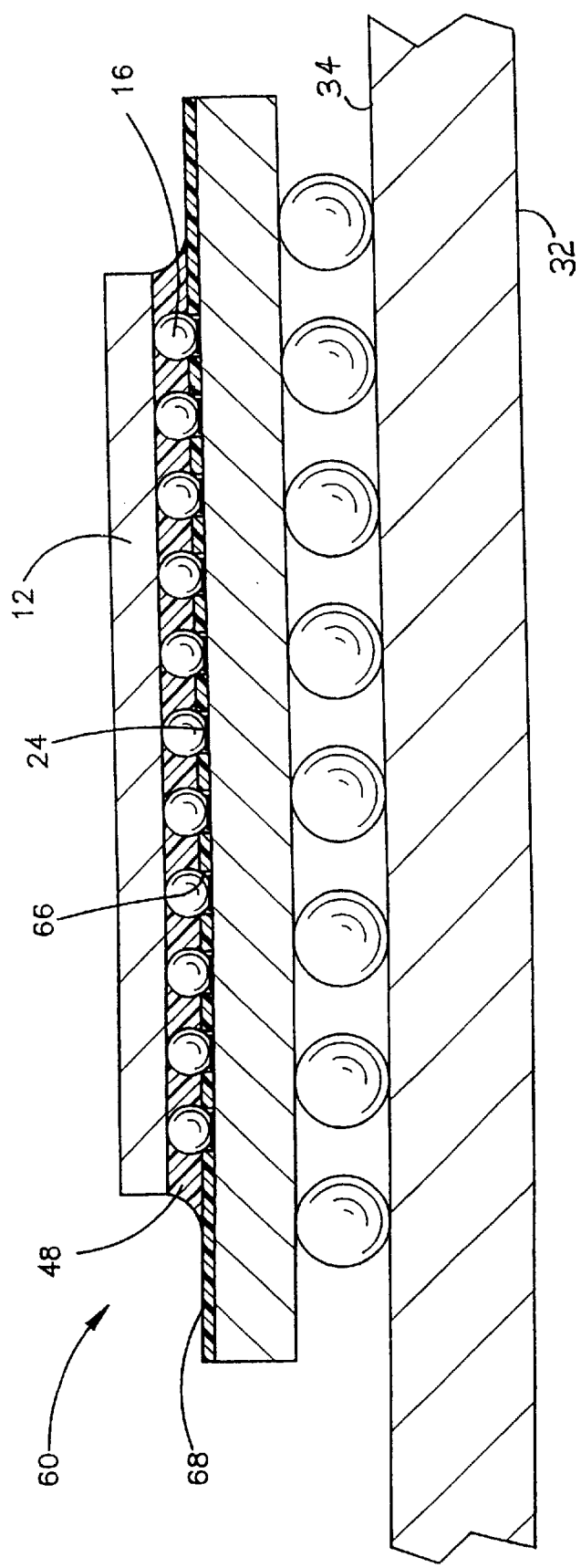
FIG. 3 is a schematic cross-sectional view of an electronic package embodying this invention.

FIG. 3 illustrates an electronic package 60 embodying this invention, which substantially reduces bending or warpage from CTE differentials and the attendant risk of early chip cracking or BGA chip fatigue. Package 60 includes a compliant layer 68, between the underfill 48 and the carrier 22, which conforms to the movements of the underfill 48 on one side and the movements of the carrier 22 on the other side. In an underfilled package like the one shown in FIG. 3, the compliant layer 68 should have a modulus of less than about one-half the modulus of the underfill 48. In general, materials with a modulus of less than about 100,000 psi are suitable, and materials having a modulus between about 50,000 psi and about 20,000 psi are preferred. Suitable materials include photoimageable interpenetrating polymer networks, rubbery materials such as silicone and viscoplastic materials such as polytretrafluoroethylene. Photoimageable interpenetrating polymer networks (IPNs) such as the cationically polymerizable epoxy based resin systems disclosed in U.S. Pat. No. 5,439,779 to Day et al., the disclosure of which is incorporated herein by reference, are especially preferred. These IPNs can be used to form solder masks which facilitate completion of the C4 connections between the chip and carrier. Their physical properties also make them highly desirable.

The preferred compliant materials are applied to the surface of carrier 22 cured and treated to provide a pattern of openings 66 that correspond to the C4 balls 16 on chip 12 and the contacts 24 on carrier 22. The chip with preformed solder balls 16 is then placed on the compliant layer and the package is heated to soften the solder balls, allowing solder to flow through the openings 66 in the compliant layer and complete connections with the contacts 24 on the carrier, leaving a space between the compliant layer and the chip that is filled with a conventional underfill material, typically after the chip has been attached to the carrier.

The relatively low modulus of compliant layer 68 allows the top of this layer to conform to the movements of underfill 48, while the bottom of the layer conforms to the movements of the carrier 22. This substantially decouples the chip expansion from the carrier expansion, which reduces stress transfer and warping of the package 60, which reduces stresses on the BGA connections and increases their reliability. The reduced coupling between the chip and substrate increases shear deformation of the C4 connections 16, but the increased reliability of the BGA connections 28, which are usually much less reliable than the C4 connections, more than offsets any decrease in the anticipated life of the C4 connections. With proper selection of materials, dimensions and other parameters, the packages of this invention can be designed so that the anticipated life of the C4 connections and the anticipated life of the BGA connections will be approximately the same, with substantially increased overall reliability.

Finite element analysis and experimental data indicate that the optimal thickness of the compliant layer is in the range of one quarter to one half of the space between the chip and carrier. Thinner layers do not reduce warpage as effectively as those within the preferred range, and thicker layers make it difficult to fill the remaining space with underfill.

Figure 4:
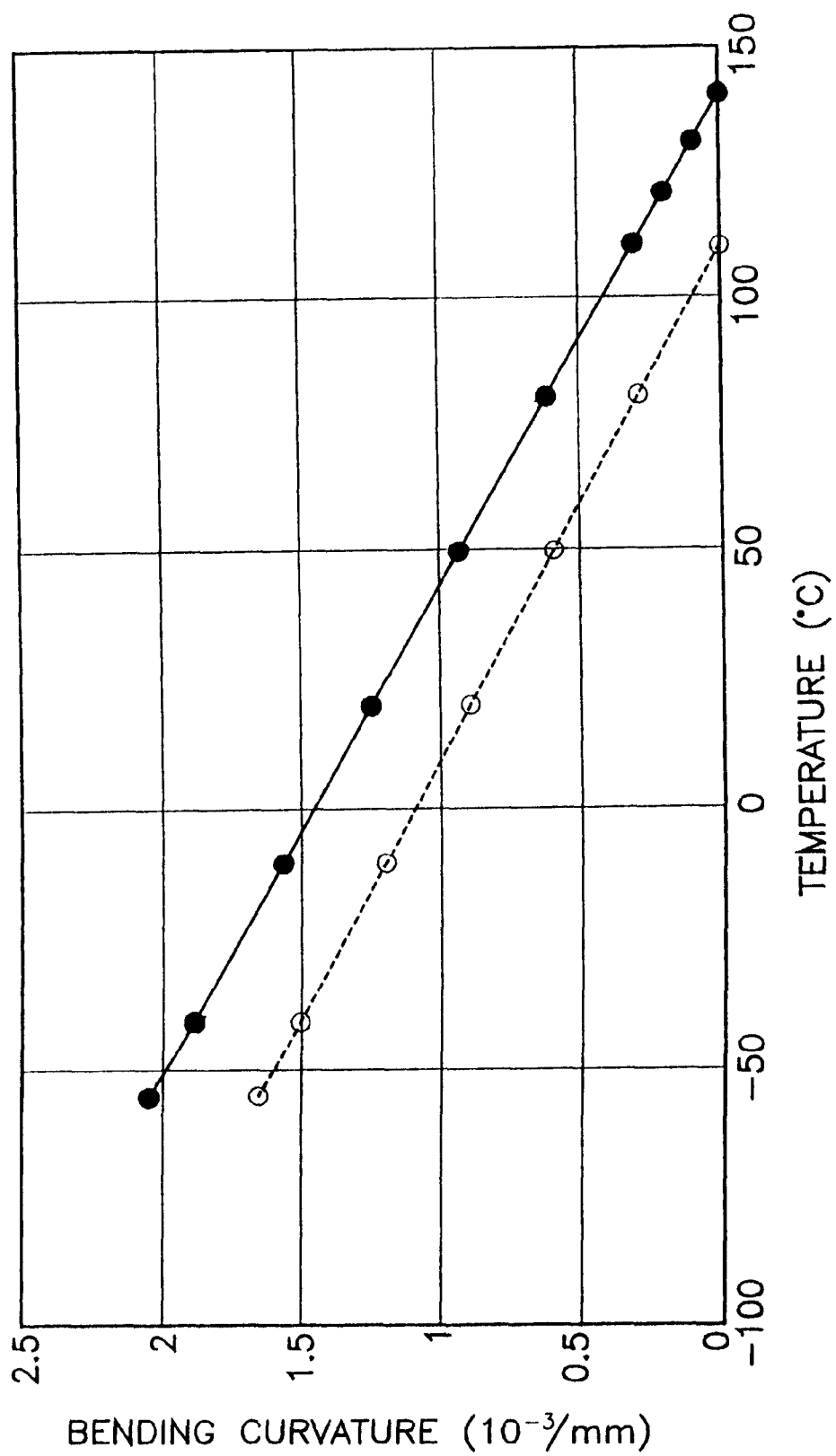
FIG. 4 is a graph of experimental data charting the curvature of a standard package and a package with the compliant layer of this invention versus temperature.

The improvements in warpage which result from the use of these materials may be seen in FIG. 4, which shows experimental warpage data (obtained by using Moiré interferometry) for a conventional chip carrier (Curve A) and a carrier with a compliant layer of this invention (Curve B). Both packages were produced with the same make and model of silicon chip, having an array of 700 solder balls in a full array. The chips were attached to glass filled epoxy laminates (produced from the same materials) having a CTE of about 18 ppm/° C. and a modulus of about 18 GPa. A compliant layer, approximately 2 mils thick, of a photoimageable interpenetrating polymer network of a polyol resin and a brominated epoxy resin having a modulus of about 0.3 GPa at 200° C. was applied to the surface of the second carrier and treated to form openings corresponding to the balls in the array on the chip and the contacts on the surface of the carrier. The balls were connected to the contacts on the carrier through the openings in the compliant layer, leaving a space of approximately 4 mils between the chip and the compliant layer. In the first carrier, which did not have a compliant layer, the space between the chip and carrier was approximately 6 mils. The open spaces around the C4 connections in each package were filled with Dexter Hysol 4511, a commercially available underfill material with a modulus of about 11 GPa at room temperature.

FIG. 4 shows that the bending curvature, which is proportional to the bending stress in the package, is a linear function of the temperature. The lower the bending curvature the lower the bending stresses. The temperature at which the package becomes flat (zero bending curvature) is defined as the "stress free temperature," or the "chip locking temperature" or the "chip coupling temperature" because from that temperature down the chip will start to be locked or to be coupled to the laminate chip carrier. Above that temperature, the chip is decoupled from the laminate chip carrier, i.e., the chip remains nearly flat and the bending curvature remains substantially zero.

As is evident from the graph, the decoupling layer in the second package effectively lowered the "chip coupling temperature," the zero bending curvature point, or the intersection of the curve to the temperature axis. In this case, the "chip coupling temperature" is lowered from 140° C. for the standard package to about 110° C. for the package with the decoupling layer. Because of the linear relation between the bending curvature and temperature the whole bending curve (line) for the package with the decoupling layer is shifted downwards. Thus we have a lower bending curvature and hence lower bending stresses in the package with the decoupling layer for the whole temperature range below that "chip coupling temperature" point.

As noted above, various other compliant materials can be used for compliant layer 68. Other techniques for preparing solder masks, such as screen printing on very low Tg materials, can be used with materials that are not photoimageable. As those skilled in the art will appreciate from the foregoing description, this invention provides an effective, practical and cost effective method for reducing warping in packages with flip chip attachments to circuitized organic dielectric substrates. These improvements are achieved without creating the alternative problems that plagued prior approaches to this problem. Of course, those skilled in the art will also appreciate that many modifications may be made to the materials, structures and methods disclosed above within the scope of this invention, which is defined by the following claims.

We claim:

1. A semiconductor package comprising:
   an integrated circuit chip;
   a circuitized organic substrate comprising a carrier having a coefficient of thermal expansion substantially higher than the coefficient of thermal expansion of said chip;
   solder connections between said chip and said substrate;
   an encapsulant comprising an underfill layer around said solder connections; and
   a layer of compliant dielectric material between said encapsulant and said circuitized organic carrier, said dielectric material having a modulus of less than about one-half the modulus of the underfill layer, and being adapted to conform to movements of the underfill layer on one side and adapted to conform to movements of said organic substrate on the other side.

2. A package according to claim 1 wherein the compliant dielectric material comprises a polymeric material having a modulus of less than about 100,000 psi.

3. A package according to claim 2 wherein said polymeric material has a modulus between about 50,000 psi and about 20,000 psi.

4. A package according to claim 3 wherein said polymeric material comprises an interpenetrating polymer network, a rubbery material or a visco-plastic polymer.

5. The semiconductor package according to claim 1 wherein the layer of compliant dielectric material includes openings corresponding to the solder connections.

6. A package according to claim 5 wherein the thickness of the layer of compliant dielectric material is between about ¼ and about ½ of the distance between the chip and the carrier.

7. A package according to claim 5 wherein the compliant dielectric material comprises an interpenetrating polymer network.

8. A package according to claim 7 wherein at least one polymer in said network is photoimageable.

9. A package according to claim 5 wherein the compliant layer comprises a solder mask.

10. A package according to claim 9 wherein the solder mask comprises a photo-imageable interpenetrating polymer network.

11. A package according to claim 10 wherein said photoimageable interpenetrating polymer network comprises an epoxy based resin system comprising a polyol resin and a brominated epoxy resin.

12. A package according to claim 11 wherein said polymer network begins a transition to a rubbery state at a temperature between about 95° C. and about 105° C.

13. Electronic equipment comprising:
    an integrated circuit chip;
    a circuitized organic dielectric chip carrier having a first set of contacts on a first surface and a second set of contacts on a second surface opposite said first surface, with contacts in said second set electrically connected to contacts in said first set;
    solder connections between said chip and carrier;
    an underfill layer around said solder connections;
    a compliant layer of an interpenetrating polymer network between said underfill layer and said chip carrier and including openings corresponding to the solder connections;
    a circuitized organic substrate having contacts on at least one surface; and
    an array of solder connections between contacts on said substrate and said second set of contacts on said carrier.

14. A method for connecting an integrated circuit chip to a substrate comprising an organic dielectric chip carrier having an array of contacts on at least one surface, comprising:
    providing an array of primary solder members projecting from an active surface of said chip;

applying a compliant layer of an interpenetrating polymer network to said surface of said substrate, covering the contacts on said surface;

forming openings in said compliant layer to allow access to the contacts on said substrate;

positioning said integrated circuit chip on said compliant layer with said projecting solder members aligned with said openings; and heating the solder members to allow solder to flow through said openings and complete electrical connections between said chip and said contacts; and forming a layer of underfill material around said solder connections between the compliant layer and the chip.

15. A method for assembling electronic components comprising:

providing an integrated circuit chip having an array of primary solder members projecting from an active surface of said chip;

providing a circuited organic dielectric chip carrier having a first set of contacts on a first surface and a second set of contacts on a second surface opposite to said first surface, with contacts in said second set electrically connected to contacts in said first set;

forming an underfill layer around said projecting solder members, between said carrier and said chip;

forming a compliant layer having openings corresponding to said projecting solder members and said contacts on said carrier and a modulus of 100,000 psi or less on said first surface of said chip carrier;

positioning said integrated circuit chip on said compliant layer with said projecting solder member aligned with said openings; and heating the solder members to allow solder to flow through said openings and complete electrical connections between said chip and said contacts;

bonding an array of secondary solder members to contacts on the second surface of said carrier;

providing a circuitized organic printed circuit board, card or other substrate having contacts on at least one surface;

positioning said carrier with said secondary solder members in contact with contacts on said substrate; and reflowing said secondary solder members to complete electrical connections from said integrated circuit chip through said primary solder members and said secondary solder members to said substrate.

* * * * *